United States Patent
Ross

(10) Patent No.: US 7,679,974 B2
(45) Date of Patent: Mar. 16, 2010

(54) MEMORY DEVICE HAVING SELECTIVELY DECOUPLEABLE MEMORY PORTIONS AND METHOD THEREOF

(75) Inventor: Ryan R. Ross, Higley, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 386 days.

(21) Appl. No.: 11/550,900

(22) Filed: Oct. 19, 2006

(65) Prior Publication Data

US 2008/0094924 A1 Apr. 24, 2008

(51) Int. Cl.
*G11C 29/00* (2006.01)

(52) U.S. Cl. ...................................................... 365/200
(58) Field of Classification Search .................. 365/200
See application file for complete search history.

(56) References Cited

U.S. PATENT DOCUMENTS 4,672,581 A * 6/1987 Waller .......................... 365/200
5,471,427 A 11/1995 Murakami et al.
5,502,674 A * 3/1996 Griffus et al. ................ 365/200
5,644,541 A 7/1997 Siu et al.
5,761,145 A * 6/1998 Zagar et al. .................. 365/226
6,021,512 A * 2/2000 Lattimore et al. ........... 714/710
6,161,188 A * 12/2000 Gaskins et al. .............. 713/501
6,202,180 B1 3/2001 Nose
6,724,669 B1 4/2004 Bhatia
6,820,224 B1 11/2004 Lin et al.
6,892,318 B2 5/2005 Blodgett
6,910,152 B2 6/2005 Blodgett
6,918,072 B2 7/2005 Cowles et al.

* cited by examiner

*Primary Examiner*—Hoai V Ho
*Assistant Examiner*—Jason Lappas

(57) ABSTRACT

In response to determining a bit cell of a bit cell array of a memory device is a defective bit cell, a portion of the bit cell array including the defective bit cell is decoupled from a power source of the memory device. The portion can be decoupled via a fuse, a transistor, and the like.

11 Claims, 3 Drawing Sheets

MEMORY DEVICE HAVING SELECTIVELY DECOUPLEABLE MEMORY PORTIONS AND METHOD THEREOF

FIELD OF THE DISCLOSURE

The present disclosure relates generally to memory devices and more particularly to defective memory repair in memory devices.

BACKGROUND

Memory devices typically are composed of an array of bit cells, with each bit cell storing a corresponding bit of data. Each bit cell generally is configured as one or more transistors that store or retain an electrical charge representative of a bit value (e.g., a logic "0" or a logic "1"). As a result of errors in the fabrication process, a subset of the bit cells of the memory device may be determined to be defective. To compensate for the likely occurrence of defective bit cells, memory devices typically implement redundant bit cells (typically arranged as redundant rows, redundant columns, redundant sectors, and combinations thereof). The memory devices typically use a fuse array or logic to reroute an memory address associated with a portion of bit cell array having a defective bit cell to a corresponding portion of the redundant bit cells (e.g., rerouting a memory address to a row having a defective bit cell to a redundant row of bit cells). However, while these techniques compensate for the operational failure of the defective bit cells, these defective bit cells often continue to draw power during operation. In certain instances, the same defect that causes a bit cell to fail functionally also results in a short in the bit cell, which can sink substantial current and cause operational failure of the entire memory device during low power states, such as while the memory device is in a sleep mode. Accordingly, an improved technique for compensating for defective bit cells in a memory device would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
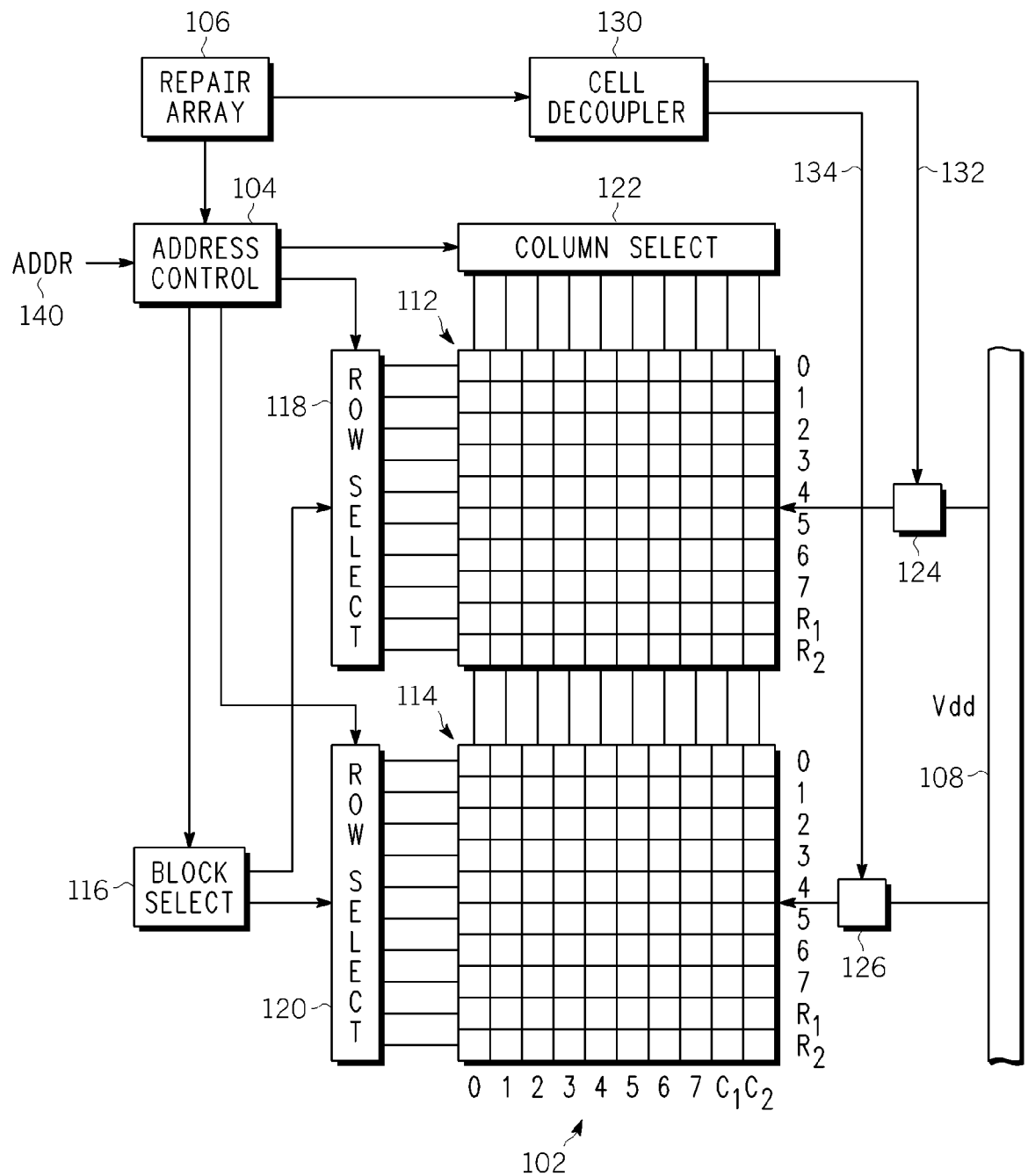
FIG. 1 is a diagram illustrating a memory device in accordance with at least one embodiment of the present disclosure.

In accordance with one aspect of the present disclosure, a method includes determining whether a first bit cell of a bit cell array of a memory device is a defective bit cell. The method further includes electrically decoupling a first portion of the bit cell array from a power source of the memory device in response to determining the first bit cell is a defective bit cell, the first portion of the bit cell array including the first bit cell.

In accordance with another aspect of the present disclosure, a memory device includes a bit cell array comprising a plurality of bit cells and means for electrically decoupling a first portion of the bit cell array from a power source in response to the first portion of the bit cell array comprising a defective bit cell.

In accordance with yet another aspect of the present disclosure, a memory device includes a bit cell array comprising a plurality of bit cells, wherein a first bit cell of the plurality of bit cells includes a defective bit cell. The memory device further includes a transistor including a first current electrode coupled to a power source, a second current electrode coupled to a power input of a first portion of the bit cell array, and a control electrode. The transistor is configured to disrupt current flow between the first current electrode and the second current electrode in response to receiving a signal having a select state at the control electrode, and the first portion comprising the first bit cell. The memory device further includes a repair array configured to store bit cell repair configuration information indicating a rerouting of a memory address from the first portion of the bit cell array having the first bit cell to a second portion of the bit cell array without the first bit cell. The memory device further includes a cell decoupler module comprising an input coupled to the repair array and an output coupled to the control electrode of the transistor. The cell decoupler module is configured to provide the signal having the select state based on the bit cell repair configuration information.

FIGS. 1-5 illustrate techniques for selectively decoupling portions of a memory array from a power source based on the presence of defective bit cells in the memory array. In one embodiment, a defective bit cell is detected during verification testing of a memory device as part of the fabrication process. To compensate for the defective bit cell, a repair array, implemented as, for example, a fuse array or readdressing logic, is configured so as to facilitate rerouting of memory addresses associated with a portion of the memory array having the defective bit cell to a redundant portion of the memory array. Likewise, the memory array is configured to electrically decouple the defective portion of the memory array from a power source. The defective portion can include, for example, a row of the memory array, a column of the memory array, or a block of the memory array, where a block comprises two or more rows, two or more columns of the memory array, or a combination thereof. In one embodiment, the defective portion of the memory array is decoupled from the power source (e.g., a voltage rail) by disabling the current flow through a transistor connected in series between the power source and the defective memory portion. In another embodiment, the defective portion of the memory array is decoupled from the power source by physically disrupting the conductive path between the power source and the defective portion of the memory, such as by "blowing" a fuse connected in series between the power source and the defective memory portion or by implementing an electronic fuse that ceases the conduction of current when the current exceeds a particular threshold.

FIG. 1 illustrates a memory device 100 in accordance with at least one embodiment of the present disclosure. The memory device 100 can be implemented as one or more separate integrated circuits (ICs), such as in an application specific integrated circuit (ASIC). Alternately, the memory device 100 can be implemented in another device, such as, for example, a microprocessor or microcontroller implemented as a system-on-a-chip (SOC). The memory device 100 can implement any of a variety of memory architectures, such as a dynamic random access memory (DRAM) architecture, a static random access memory (SRAM) architecture, a non-volatile architecture (e.g., flash memory), a magnetic random access memory (MRAM) architecture, and the like.

In the depicted example, the memory device 100 includes a memory array 102, an address controller 104, a repair array 106, and a power source 108 (e.g., a voltage $V_{dd}$ rail). The memory array 102 includes an array of bit cells logically arranged in one or more portions. In the example of FIG. 1, the array of bit cells is logically arranged as two blocks of bit cells, blocks 112 and 114. Further, in the illustrated example, each of the blocks 112 and 114 comprise bit cells arranged as rows 0-7 and columns 0-7. Each of blocks 112 and 114 further has redundant bit cells arranged as redundant rows R1 and R2 and redundant columns C1 and C2. For the illustrated two-block example of FIG. 1, the memory array 102 further includes a block select module 116, a row select module 118 corresponding to the block 112 and a row select module 120 corresponding to the block 114, and a column select module 122.

The memory array 102 further includes a decoupling mechanism 124 configured to selectively decouple the power source 108 from one or more portions of the block 112 and a decoupling mechanism 126 configured to selectively decouple the power source 108 from one or more portions of the block 114. In one embodiment, the decoupling mechanisms 124 and 126 comprise transistors that can be individually disabled so as to disrupt the flow of current from the power source 108 to a corresponding portion of the array of bit cells. In this instance, the memory device 100 further can include a cell decoupler module 130 having an input coupled to, for example, the repair array 106 and an output to provide control signals 132 and 134 to the decoupling mechanisms 124 and 126, respectively. In another embodiment, the decoupling mechanisms 124 and 126 comprise passive fuses, electronic fuses, or other disruptable devices that can be individually configured to be non-conductive so as to disrupt the flow of current from the power source 108 to a corresponding portion of the array of bit cells.

The repair array 106 can include an array of fuses or programmable logic to reroute memory addresses between different memory portions. Subsequent to the initial fabrication of the array of bit cells of the memory array 102, the memory array 102 is subjected to verification testing to identify whether any bit cells are defective. In response to identifying a bit cell as defective, the repair array 106 is configured so that a memory address that otherwise would route to a row or column that included the defective bit cell is rerouted to one of the redundant rows and/or columns of the corresponding block. To illustrate, assume, for example, that the bit cell at row 3, column 4 of the block 112 is determined to be defective. Without rerouting of memory addresses, a memory access to row 3 would result in a bit error at the fourth bit position (corresponding to column 4). In this example, the repair array 106 can be configured so that memory addresses corresponding to row 3 are rerouted to, for example, the redundant row R1 of the block 112. Accordingly, in response to receipt of a memory access request associated with a memory address (ADDR) 140, the address controller 104 determines the corresponding routing based on the configuration of the repair array 106 and controls the block select module 116, the row select modules 118 and 120, and the column select module 122 to access the appropriate row and columns of the appropriate block for performing the memory access.

In addition to configuring the repair array 106 to reroute memory addresses away from a defective portion of the memory array 102, the corresponding one of the decoupling mechanisms 124 and 126 is configured so as to decouple the defective portion from the power source 108. In instances whereby the decoupling mechanisms 124 and 126 are transistor-based, the cell decoupler 130 can be configured to provide the control signals 132 and 134 based on the repair array 106 so as to configure the transistor associated with the defective portion of the memory array to be non-conductive and to configure the transistor associated with the newly-routed portion of memory array to be conductive. In instances whereby one or both of the decoupling mechanisms 124 and 126 are fuse-based, the decoupling mechanisms 124 and 126 can be configured to decouple the defective portion of the memory array by configuring the fuse to be non-conductive. Further, in at least one embodiment, one or both of the decoupling mechanisms 124 and 126 can implement one or more electronic fuses, where each electronic fuse is configured to cease the conduction of current between its input and its output in response to a detected overcurrent at its input that likely results from a defective bit cell connected to its output.

Figure 2:
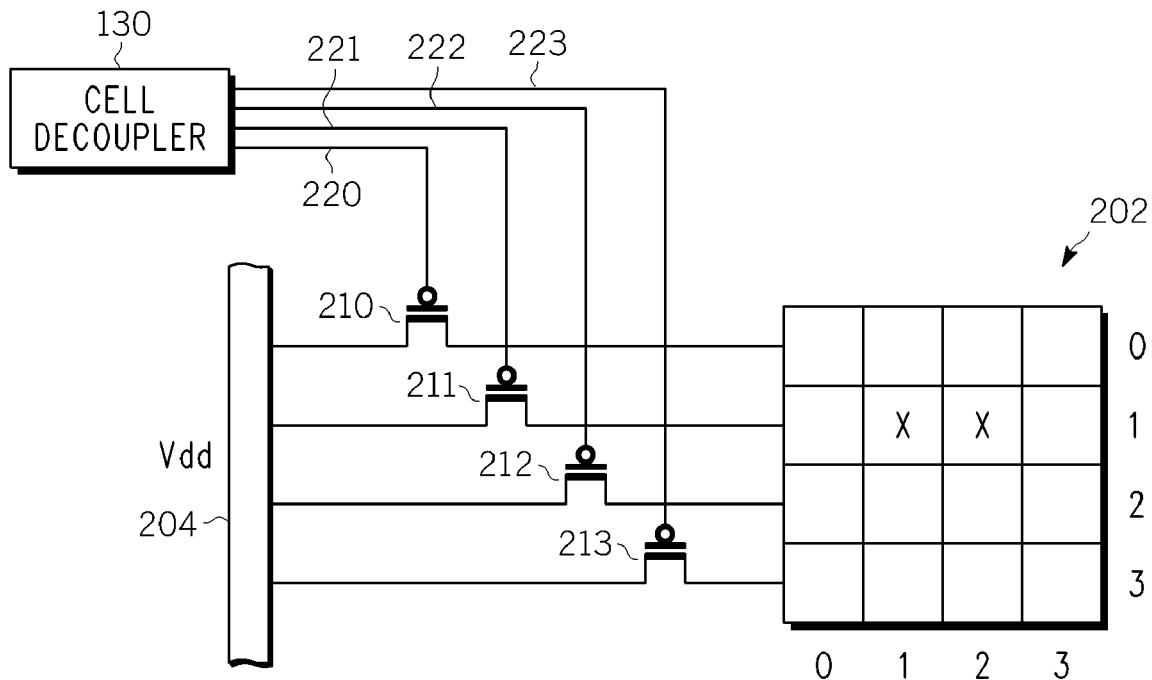
FIG. 2 is a diagram illustrating a transistor-based technique for selectively decoupling a row of bit cells from a power source in accordance with at least one embodiment of the present disclosure.

FIG. 2 illustrates a transistor-based decoupling mechanism 200 in accordance with at least one embodiment of the present disclosure. In illustrated example, a bit cell array 202 is arranged as, for example, four rows (rows 0-3) and four columns (columns 0-3), whereby power is supplied to the bit cell array 202 from a voltage rail 204 on a row-by-row basis. Accordingly, to selectively disrupt the power supplied to each row of the bit cell array, the decoupling mechanism 200 includes four transistors (transistors 210, 211, 212, and 213), each connected in series between the voltage rail 204 and the power inputs of a corresponding row of the bit cell array 202. In one embodiment, the transistors 210, 211, 212, and 213 comprise p-type transistors so that they are normally enabled unless the corresponding control line (control lines 220, 221, 222, and 223) is configured to a high voltage state. However, as many p-type transistors can exhibit inhibited conductive characteristics compared to n-type transistors, in other embodiments the transistors 210, 211, 212, and 213 can comprise n-type transistors.

In the event that a defective bit cell is identified, the cell coupler module 130 can be configured (e.g., by configuring the repair array 106) to disable the transistor connecting the row having the defective bit cell from the voltage rail 204 while enabling the transistors connecting the rows without defective bit cells to the voltage rail 204. To illustrate, assume that the bit cells of row 1 at columns 1 and 2 of the bit cell array 202 are identified as defective. In this example, assuming the transistors 210, 211, 212, and 213 are p-type transistors, the cell decoupler module 130 can configure the control signal 221 to provide a high voltage and configure the control signals 220, 222, and 223 to each provide a low voltage. With the control signals 220, 221, 222, and 223 so configured, the transistors 210, 212, and 213 are enabled, thereby electrically coupling rows 0, 2, and 3 to the voltage rail 204, and the transistor 211 is disabled, thereby electrically decoupling row 1 from the voltage rail 204. As a result, the row 1 is disconnected from the power source and therefore cannot consume power during operation.

Figure 3:
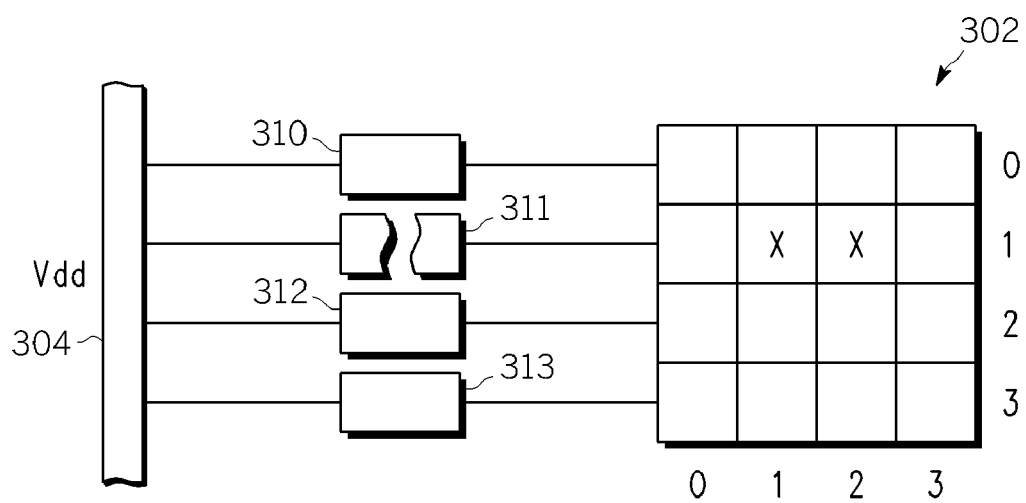
FIG. 3 is a diagram illustrating a fuse-based technique for selectively decoupling a row of bit cells from a power source in accordance with at least one embodiment of the present disclosure.

FIG. 3 illustrates a fuse-based decoupling mechanism 300 in accordance with at least one embodiment of the present disclosure. In illustrated example, a bit cell array 302 is arranged as, for example, four rows (rows 0-3) and four columns (columns 0-3), whereby power is supplied to the bit cell array 302 from a voltage rail 304 on a row-by-row basis. To selectively disrupt the power supplied to each row of the bit cell array, the decoupling mechanism 300 includes four fuses (fuses 310, 311, 312, and 313), each connected in series between the voltage rail 304 and the power input of a corresponding row of the bit cell array 302. The fuses 310, 311, 312, and 313 can include any of a variety of fuse types, such as a metal fuse, a polysilicon fuse, a laser fuse, and the like.

Assuming the fuses 310, 311, 312, and 313 initially are conductive, in the event that a defective bit cell is identified, the fuse connecting the row having the defective bit cell to the voltage rail 304 can be manipulated to change to a non-conductive state, such as by applying a sufficiently high current to the fuse in instances whereby the fuse is a metal fuse or a polysilicon fuse, by applying laser light or ultraviolet light to the fuse in instances whereby the fuse is a laser fuse, or by using etching or laser ablation to remove conductive material so as to create a non-conductive region spanning the entire width of the fuse in instances whereby the fuse is a conductive trace. To illustrate, assume that the bit cells of row 1 at columns 1 and 2 of the bit cell array 302 are identified as defective and that the fuses 310, 311, 312, and 313 are laser fuses. In this example, the fuses 310, 312, and 313 are maintained in their conductive configurations, thereby electrically coupling rows 0, 2, and 3 to the voltage rail 304, and the fuse 311 is "blown" by application of a laser, thereby electrically decoupling row 1 from the voltage rail 304. As a result, the row 1 is disconnected from the power source and therefore cannot consume power during operation.

In some instances, defective bit cells can sink significantly more current than operational bit cells due to the presence of shorts in the defective bit cells. Accordingly, rather than using passive fuses, in an alternate embodiment, the fuses 310, 311, 312, and 313 are electronic fuses. The electronic fuses each have an input and an output, and are configured to selectively enable a conductive path between the input and the output based on the level of the current at the input. Thus, the electronic fuses can be configured so that the lower current levels drawn by operational bit cells do not cause an electronic fuse to activate, or "trip," whereas the higher current level drawn by a defective bit cell would cause the electronic fuse to activate, thereby decoupling the power inputs of the bit cells monitored by the electronic fuse from the power source. To illustrate using the example above, the aggregate current drawn by the bit cells of row 0 of the bit cell array 302 would not activate the fuse 310 (as an electronic fuse) as all of the bit cells of row 0 are operational in this example, whereas the aggregate current drawn by the bit cells of row 1 of the bit cell array 302 would activate the fuse 311 (as an electronic fuse) due to the relatively high current draw of the defective bit cells at columns 1 and 2 of row 1. Thus, by using electronic fuses, the memory device fabricator can forgo the process of actively configuring the fuses to be conductive or non-conductive based on whether they are associated with a portion of memory having defective bit cells. Instead, the electronic fuses would be automatically activated in response to the relatively high currents initially drawn by the defective bit cells at the start of operation of the memory device.

Figure 4:
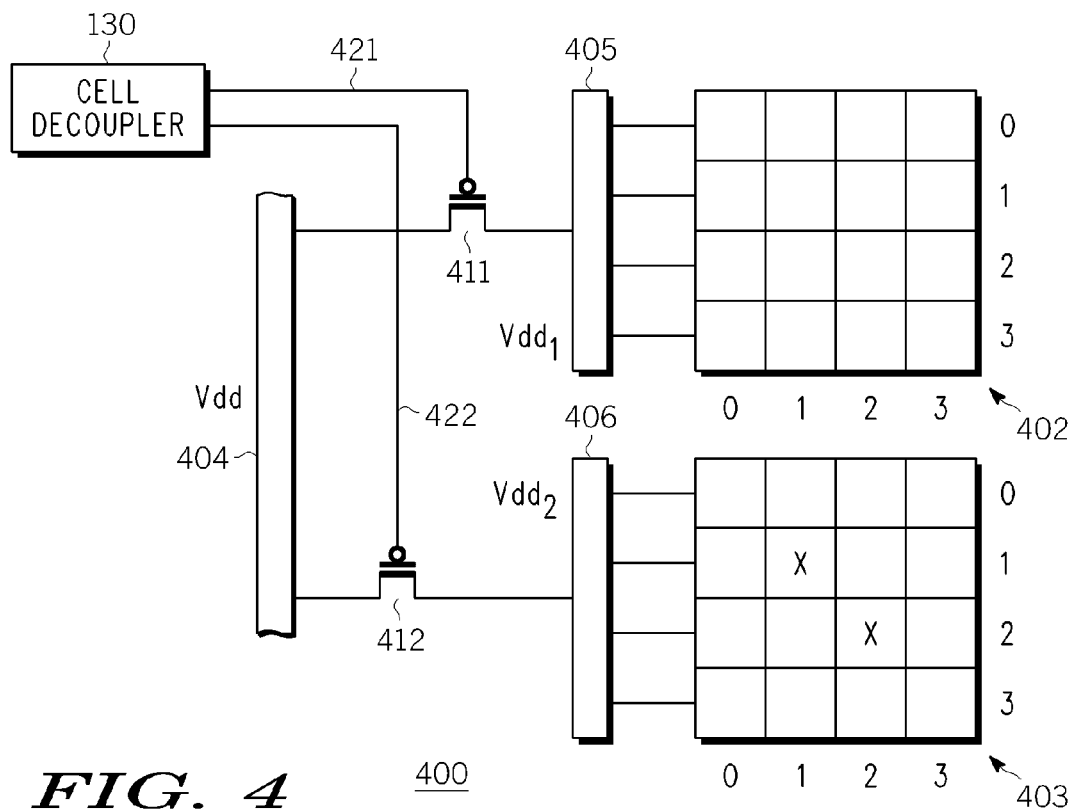
FIG. 4 is a diagram illustrating a transistor-based technique for selectively decoupling a block of bit cells from a power source in accordance with at least one embodiment of the present disclosure.

FIG. 4 illustrates a transistor-based decoupling mechanism 400 in accordance with at least one embodiment of the present disclosure. In illustrated example, a bit cell array is arranged as, for example, blocks 402 and 403, each block having four rows (rows 0-3) and four columns (columns 0-3), whereby power is supplied from a main voltage rail 404 to block voltage rails 405 and 406, and from block voltage rail 405 to the power inputs of each of the rows of the block 402 and from the block voltage rail 406 to the power inputs of each of the rows of the block 403. Thus, as depicted, the cell decoupling module 130 can individually decouple the blocks 402 and 404 from a power source by disabling transistors 411 or 412, respectively.

To illustrate, assume that the bit cells at row 1, column 1 and at row 2, column 2 of the block 402 are identified as defective. In this example, assuming the transistors 411 and 412 are p-type transistors, the cell decoupler module 130 can configure the control signal 421 to provide a low voltage so as to enable the transistor 411, thereby electrically coupling the block voltage rail 405 to the main voltage rail 404, and thereby electrically coupling the block 402 to a power source. Further, the cell decoupler module 130 can configure the control signal 422 to provide a high voltage so as to disable the transistor 412, thereby electrically decoupling the block voltage rail 406 from the main voltage rail 404, and thereby electrically decoupling the block 403 from the power source so that the defective bit cells of the block 403 do not consume power while the memory device is operated.

Figure 5:
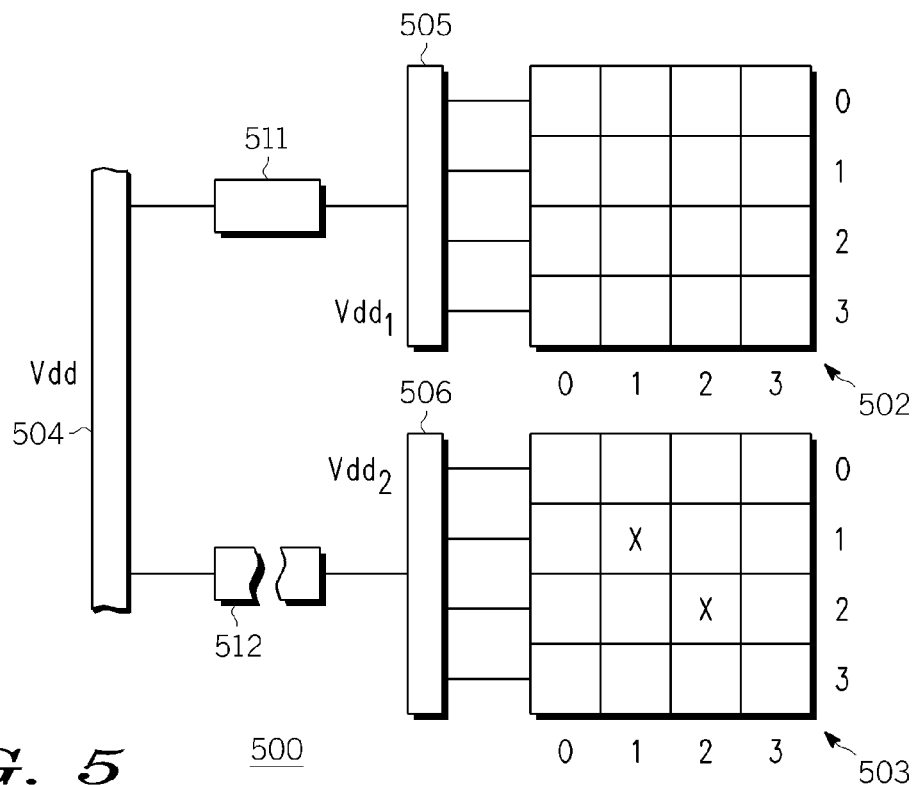
FIG. 5 is a diagram illustrating a fuse-based technique for selectively decoupling a block of bit cells from a power source in accordance with at least one embodiment of the present disclosure.

FIG. 5 illustrates a fuse-based decoupling mechanism 500 in accordance with at least one embodiment of the present disclosure. In illustrated example, a bit cell array is arranged as, for example, blocks 502 and 503, each block having four rows (rows 0-3) and four columns (columns 0-3), whereby power is supplied from a main voltage rail 504 to block voltage rails 505 and 506, and from block voltage rail 505 to the power inputs of each of the rows of the block 502 and from the block voltage rail 506 to the power inputs of each of the rows of the block 503. Thus, as depicted, fuses 511 and 512 can be used to selectively decouple one or both of the blocks 502 and 503, respectively, from a power source. As with the fuse-based decoupling mechanism 300 of FIG. 3, the buses 511 and 512 can include passive fuses, such as polysilicon fuses or laser fuses, or active fuses, such as electronic fuses.

To illustrate, assume that the bit cells at row 1, column 1 and at row 2, column 2 of the block 503 are identified as defective. In this example, the fuse 511 can be maintained in its conductive state, thereby electrically coupling the block voltage rail 505 to the main voltage rail 504, and thereby electrically coupling the block 502 to a power source. Further, the fuse 512 can be blown in response to detecting the defective bit cells, thereby electrically decoupling the block voltage rail 506 from the main voltage rail 504, and thereby electrically decoupling the block 503 from the power source so that the defective bit cells of the block 503 do not consume power while the memory device is operated.

Although FIGS. 2 and 3 illustrate row-based selective decoupling techniques and FIGS. 4 and 5 illustrate block-based selective decoupling techniques, various combinations of the techniques of FIGS. 2-5 can be implemented at varying hierarchies of a memory device without departing from the scope of the present disclosure. For example, the fuse-based decoupling mechanism 500 of FIG. 5 can be used to selectively decouple a block of a memory array in the event that a significant proportion of the bit cells of the block are defective and the transistor-based decoupling mechanism 200 of FIG. 2 can be used to selectively decouple rows of a block of the memory array in the event that the block has relatively few defective bit cells.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A method comprising:
    determining whether a select bit cell of a bit cell array of a memory device is a defective bit cell; and
    electrically decoupling the select bit cell from a power source of the memory device by disrupting a conductivity of a fuse coupling a power input of a select portion of the bit cell array to the power source in response to determining the select bit cell is a defective bit cell, the select portion comprising the select bit cell.

2. The method of claim 1, wherein disrupting the conductivity of the fuse comprises applying light energy to the fuse.

3. The method of claim 1, wherein disrupting the conductivity of the fuse comprises applying a current to the fuse.

4. The method of claim 1, further comprising:
    configuring a repair array to indicate a rerouting of a memory address associated with the select portion of the bit cell array to another portion of the bit cell array.

5. The method of claim 1, wherein a first portion of the bit cell array includes the select bit cell, the method further comprising:
    determining whether any bit cell of a second portion of the bit cell array is a defective bit cell; and
    electrically coupling the second portion of the bit cell array to the power source of the memory device in response to determining no bit cell of the second portion of the bit cell array is a defective bit cell.

6. The method of claim 5, wherein:
    electrically coupling the second portion of the bit cell array to the power source comprises maintaining a conductivity of a second fuse coupling a power input of the second portion of the bit cell array to the power source.

7. The method of claim 1, wherein electrically decoupling the select bit cell from the power source comprises configuring the memory device to electrically decouple the select bit cell during a fabrication of the memory device.

8. A memory device comprising:
    a bit cell array comprising a plurality of bit cells;
    a fuse comprising an input coupled to a power source and an output coupled to a power input of a select portion of the bit cell array, the fuse configurable to decouple the power input of the select portion from the power source in response to the select portion comprising a defective bit cell.

9. The memory device of claim 8, further comprising a repair array configurable to facilitate rerouting of memory addresses at the memory device.

10. The memory device of claim 8, wherein a first portion of the bit cell array comprises the select portion, the memory device further comprising:
    means for electrically coupling a second portion of the bit cell array to the power source in response to the second portion of the bit cell array not comprising a defective bit cell.

11. The memory device of claim 10, wherein:
    the means for electrically coupling the second portion of the bit cell array comprises a second fuse configurable to couple a power input of the second portion of the bit cell array to the power source.

* * * * *